United States Patent
Mizuta

[11] Patent Number: 6,065,986
[45] Date of Patent: May 23, 2000

[54] SOCKET FOR SEMICONDUCTOR DEVICE

[75] Inventor: Masaharu Mizuta, Tokyo, Japan

[73] Assignee: Mitsubishi Denki Kabushiki Kaisha, Tokyo, Japan

[21] Appl. No.: 09/153,268

[22] Filed: Sep. 14, 1998

[30] Foreign Application Priority Data

Dec. 11, 1998 [JP] Japan ..................... 9-341348

[51] Int. Cl.⁷ .................................. H01R 11/22
[52] U.S. Cl. .................................................. 439/266
[58] Field of Search ..................... 439/266, 330, 439/265, 268, 269, 331, 264

[56] References Cited

U.S. PATENT DOCUMENTS 5,683,262  11/1997  Matsuoka et al. ............... 439/266

FOREIGN PATENT DOCUMENTS

414877   4/1991  Japan .
562748   3/1993  Japan .
5182730  7/1993  Japan .
8227772  9/1996  Japan .

*Primary Examiner*—Steven L. Stephan
*Assistant Examiner*—Eugene G. Byrd
*Attorney, Agent, or Firm*—Leydig, Voit & Mayer, Ltd.

[57] ABSTRACT

A socket for a semiconductor device usable with semiconductor devices having different sizes, the same number and positions of external leads, and leads suitable for transmission of high-speed signals. A semiconductor device is positioned by placing a movable contact of the socket in contact with the outer end surface of a corresponding external lead of the semiconductor device and urging each movable contact inwardly from an outer position. Simultaneously, an electrical connection between the external lead and the movable contact is made by a contact, under pressure, and located between the upper surfaces of the external lead and corresponding movable contacts.

3 Claims, 8 Drawing Sheets

SOCKET FOR SEMICONDUCTOR DEVICE

BACKGROUND OF THE INVENTION

1. Field of the Invention

The present invention relates to a socket for a semiconductor device, the socket being used to connect external leads of a surface-mounting semiconductor device to an external circuit for testing, etc.

2. Description of the Related Art

Figure 9:
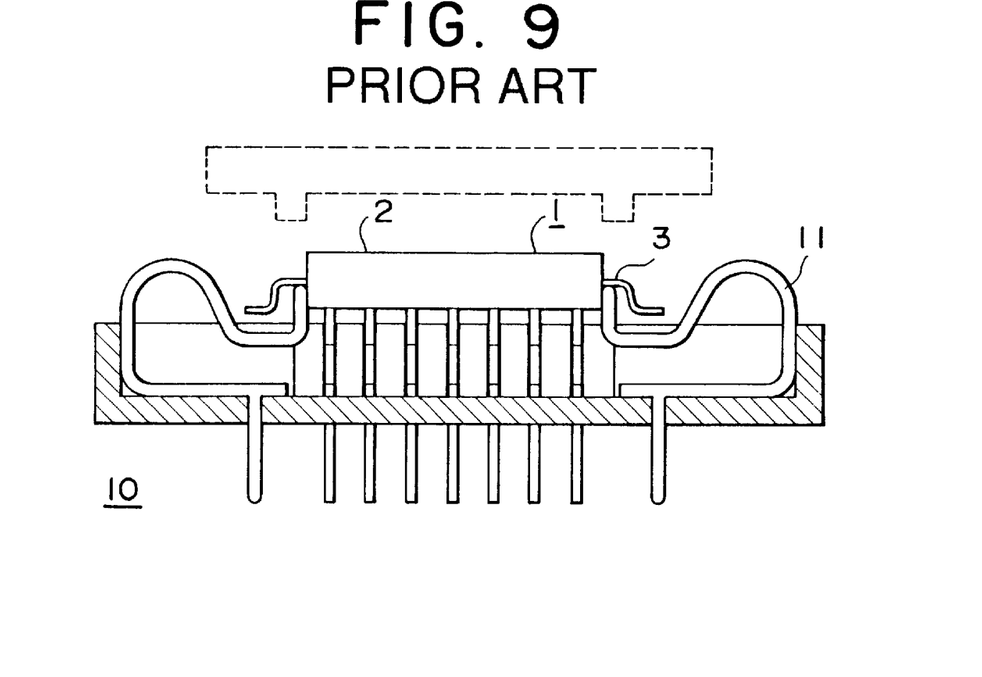
FIG. 9 is a sectional side view of a conventional socket for a semiconductor device.

FIG. 9 is a sectional side elevation view of a conventional socket for a semiconductor device disclosed in, for example, Japanese Examined Utility Model Publication No. 4-14877. In FIG. 9, external leads 3 extend outwardly from every side of a package 2 of the surface-mounting semiconductor device 1. Contacts 11 of the socket 10 for the semiconductor device, having a springing property are disposed at positions corresponding to each of the external leads 3 of the semiconductor device 1.

In this socket 10, positioning and supporting of the semiconductor device 1 are performed by placing the contacts 11 on the bottom side of the external leads 3 and on the side faces of the package 2. Electrical connection is achieved by urging a member such as a holding cover, which is shown by a broken line, toward the upper portion of the external leads 3, opposite to the portion where the contacts 11, having a springing property, have been placed.

Figure 10:
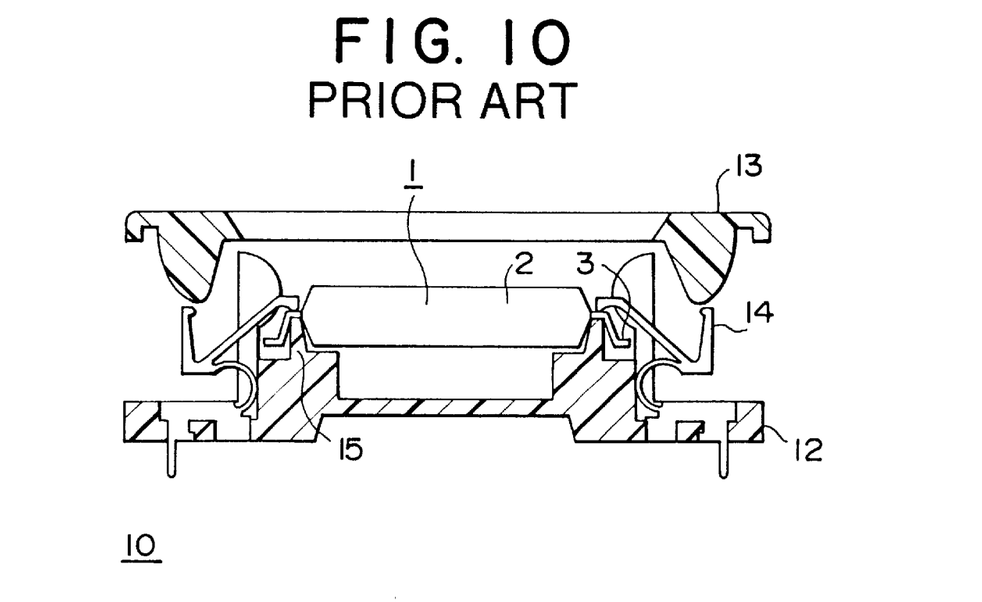
FIG. 10 is a sectional side view of another conventional socket for a semiconductor device.

FIG. 10 is a sectional side elevation view of another conventional socket for a semiconductor device disclosed in, for example, Japanese Unexamined Patent Publication No. 8-227772. Members that are common with or equivalent to those of FIG. 9 are designated using like reference characters. A movable cover 13 moves up and down above a body 12 of the socket 10, and movable contact terminals 14, having a springing property, are disposed in the body 12 at positions corresponding to the external leads 3, and a positioning base 15 is also disposed in the body 12 to position the semiconductor device 1.

In this socket 10, positioning as well as supporting of the semiconductor device 1 is performed by placing the positioning base 15 underneath the root portion of the external leads 3, sliding the positioning base 15, which is a thin and tall square frame as viewed from above being, disposed in the body 12, from a side of the package 2 of the semiconductor device 1. At a pressed-down position of the movable cover 13, the semiconductor device 1 is set into the socket 10 (the movable contact terminals 14 are relieved from the top surface of the external leads 3 by a downward motion of the movable cover 13), and then, when the force applied to the movable cover 13 is relieved, it moves upwardly by its spring force so that the movable contact terminals 14 are placed on the top surface of the external leads 3 opposite to the portion attached to the frame of the positioning base 15 by a spring force of the movable contact terminals 14. This results in electrical connection between the external leads 3 and the movable contact terminals 14.

In any of the conventional sockets for a semiconductor device formed as above, positioning is performed by adapting the outer surfaces of the package of the semiconductor device. Then, the problem lies in the necessity to prepare each socket for each semiconductor device from each manufacturer, because there is no commonality of size packages from each manufacturer, even if the number and positions of leads are the same. That is, although there is commonality of the tip end positions of the leads, which is important when mounting the semiconductor on a printed board, the dimensions of the outside shape of the package are different for each manufacturer. Therefore, a specific socket for each semiconductor device from each manufacturer has been necessary.

In addition, in any of the conventional sockets for a semiconductor device, the contacts or the movable contact terminals for electrical connection to the external leads, have been designed as a single unit with the portion to be mounted on the printed board for testing, the spring portion and the top or bottom side of the external leads, linking together. This causes the length of the contacts or the movable contact terminals to be longer and the outer shape of the socket to be larger. Therefore, there has been a problem that these sockets are not suitable for the transmission of high-speed signals because of the long length of the electrical path.

SUMMARY OF THE INVENTION

Accordingly, it is an object of the present invention to solve the above-mentioned problems by providing a socket for semiconductors, which can be miniaturized, having a commonality for use as long as the number and the positions of the external leads of the semiconductor are the same, and being suitable for transmission of high-speed signals.

In view of the above-mentioned object, the present invention provides a socket for a semiconductor device for use as an electrical connection between external leads of the semiconductor and an external circuit to test the semiconductor, the socket comprising a body and a movable cover, in which the body includes a plurality of movable contacts having a springing property being disposed at positions corresponding to each external lead and surrounding the position where the semiconductor is to be set, the body further including positioning means for positioning the semiconductor by urging the movable contacts inwardly toward the outer end surface of each external lead from outer positions, and in which the movable cover being capable of moving up and down above the body includes a plurality of movable contact terminals to connect each external lead to the movable contact that corresponds to the external lead, wherein when the movable cover moves closer to the body, the semiconductor is ready to be set, and when it moves away from the body the positioning means performs positioning by placing each movable contact in contact with the outer end surface of each external lead by urging the movable contacts inwardly from outer positions, while simultaneously the movable contact terminals, by their springing property, make contact under pressure with the upper surfaces of each external lead and of each movable contact, which is placed in contact with the external lead, to electrically connect them to each other.

The present invention further provides a socket for a semiconductor device, wherein the positioning means comprises an urging mechanism assembly which urges the movable contacts toward the external leads according to the movable cover operation, wherein the body further comprises projection portions which actuate each movable contact terminal of the movable cover against a spring force of the movable contact terminal according to the movable cover operation.

The present invention also provides a socket for a semiconductor device, wherein the positioning means further comprises a plurality of movable supporting plates having a difference in level, an outer portion of the movable supporting plate being thicker than its inner portion which supports the external leads, the movable supporting plates having through holes at an inside edge portion of the difference in level containing the movable contacts which are placed in contact with the outer surfaces of the external leads, the movable supporting plate being to extend in the direction of a row of the external leads, and an urging mechanism assembly which urges the movable contacts toward the external leads by moving the movable supporting plates according to the movable cover operation, wherein the body further comprises projection portions which actuate the movable contact terminals against a spring force thereof according to the movable cover operation.

DESCRIPTION OF THE PREFERRED EMBODIMENTS

Figure 1:
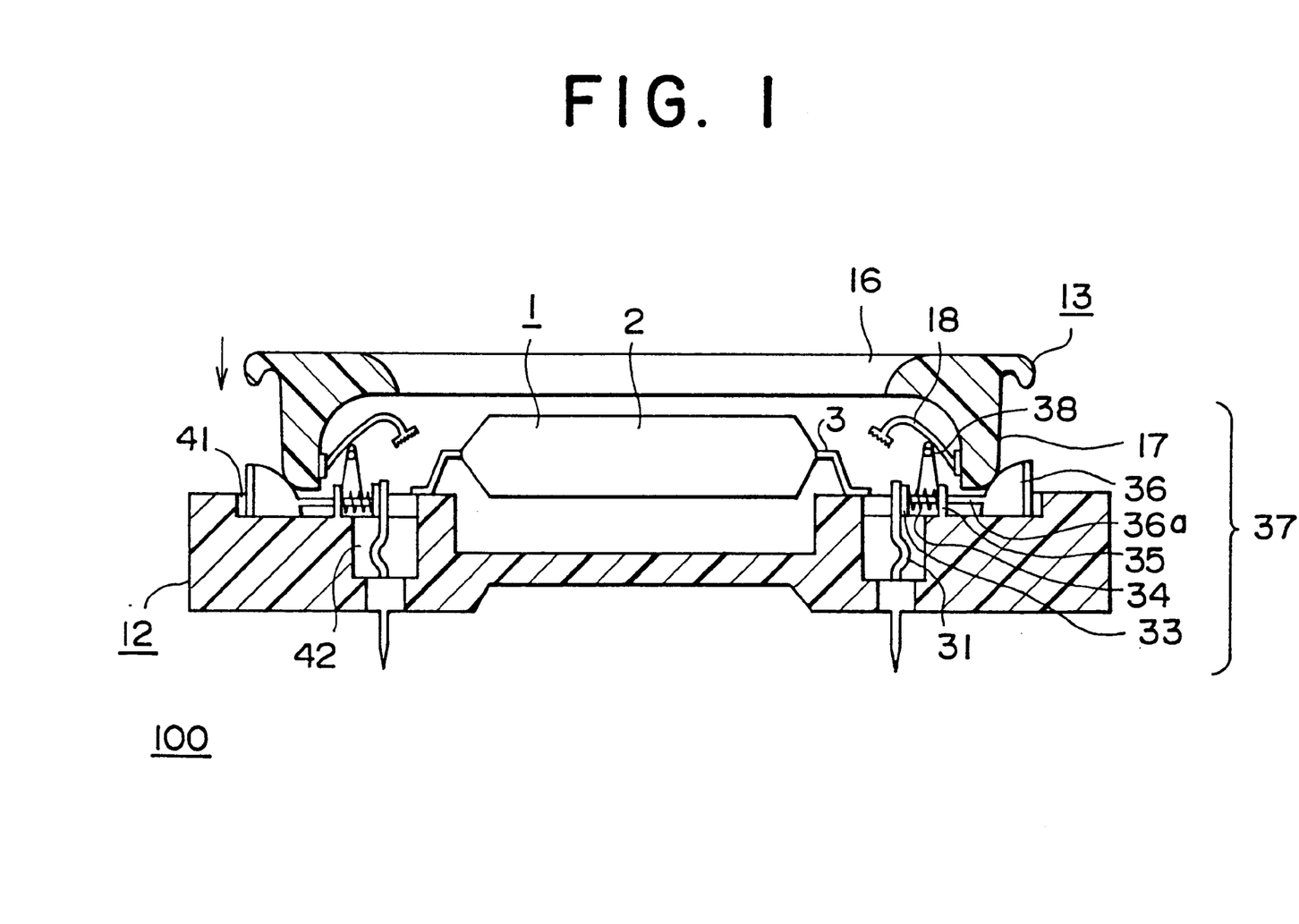
FIG. 1 is a sectional side view showing a semiconductor device in a socket in accordance with one of the embodiments of the present invention.
Figure 2:
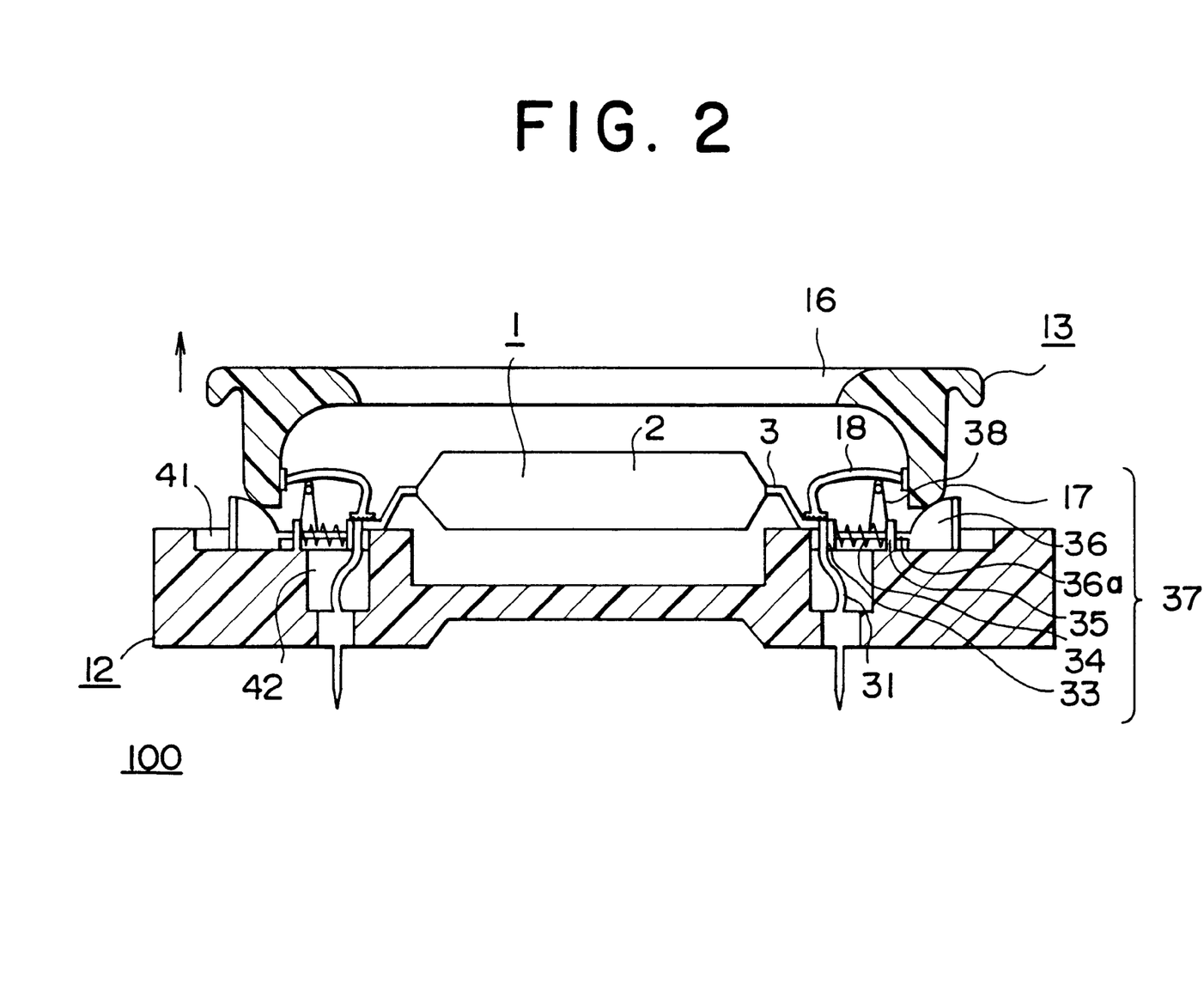
FIG. 2 is a sectional side view of the socket in FIG. 1 showing positioning and testing the semiconductor device.

This invention will be described with reference to each embodiment.
First Embodiment FIGS. 1 and 2 are sectional side views showing a configuration according to an embodiment of the present invention. FIG. 1 shows a a socket ready for setting of a semiconductor device therein. FIG. 2 shows positioning of a set semiconductor device and simultaneous connection of the external leads of the semiconductor device to an outer testing circuit (not shown).

In both drawings, the socket 100 comprises a body 12 and a movable cover 13, which is movable up and down above the body 12. An opening 16 of the movable cover 13 is for inserting and removing the semiconductor device 1. The semiconductor device 1 is set on the body 12 as shown in FIG. 1 when the movable cover 13 is pressed downwardly to relieve movable contacts 31 and movable contact terminals 18 outwardly as shown in FIG. 1.

An engagement portion 17, shown in FIG. 1, outwardly moves an R-surface member 36 of an urging mechanism assembly 37, which will be described, in the body 12. At this time, the movable contacts 31 are in an outer position being free from an external force. The movable contacts 31, having a springing property, are located in the body 12 in outer positions corresponding to each external lead when the semiconductor device 1 is set. The movable contact terminals 18, having a springing property, are disposed in positions of the movable cover 13 corresponding to each external lead of the semiconductor device 1. The movable contact terminals 18, in the state shown in FIG. 1, are released from the external leads 3 and the movable contacts 31 are pushed, against their own spring force, by a projection member 38, which will be described, in the body 12.

In the body 12, the lower portion of the movable contact 31 is fixed to the body 12 while the upper portion is deflectable along a slot 42 extending from an inner position to an outer position in the body 12. The bottom end of the movable contact 31 is electrically connected to a through hole of a board, such as a circuit board for testing, or an external burn-in board (not shown). The urging mechanism assemblies 37, provided for each movable contact 31, in the state shown in FIG. 1, are located at outer positions by an action of the engagement portion 17 of the movable cover 13 so as to separate the movable contact 31 from the outer end surface of the external lead 3 by freeing the movable contact 31.

On the other hand, when the movable cover 13 moves upwardly by a spring (not shown) force, upon being released from a downward force, the spring 34, which has a force that is stronger than that of the movable contact 31, places the movable contact 31 into contact with the outer surface of the external lead 3, while simultaneously positioning the semiconductor device 1 based on the tip end positions of the external leads 3 by urging the movable contacts 31 inwardly from outer positions.

The urging mechanism assembly 37 comprises a contact urging portion 33 urging the movable contact 31, the R-surface member 36 having an R-surface in engagement with the engaging member 17, a shaft 36a linking the urging portion 33 and the R-surface member 36, a spring 34 urging the movable contact 31 toward the outer end surface of the external lead 3, a bearing portion 35 supporting the shaft 36a like a bearing and the engaging member 17 described above. The projection member 38, in the state shown in FIG. 1, is provided to release each movable contact terminal 18 against its spring force from the external lead 3 and the movable contact 31. This projection member 38 is a member like a bar extending along the movable contact terminals 18, which are transversely disposed.

Figure 3:
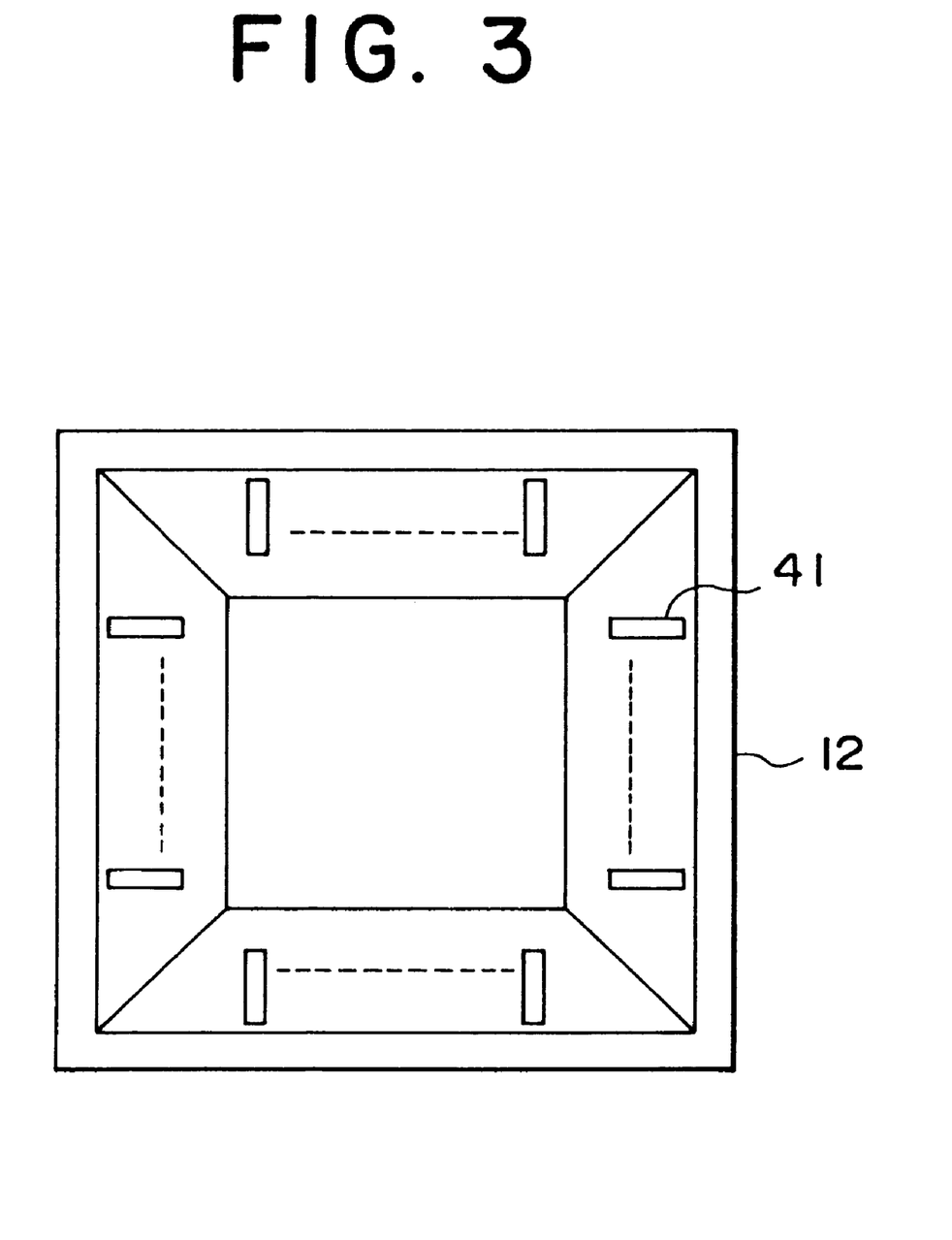
FIG. 3 is a plan view showing guide slots of the body of the socket shown in FIG. 1.

A guide slot 41 is a slot containing the movable contact 31 and the urging mechanism assembly 37 and guiding them simultaneously. FIG. 3 is a top plan view of the guide slots. The slot 42 is a slot extending in the deflection direction of the upper portion of the movable contacts 31.

In the socket 100 formed as mentioned above, at first, the semiconductor device 1 is set on the body 12, as shown in the drawing, by downwardly pressing the movable cover 13 to move the movable contacts 31 and the movable contact terminals 18 outwardly, as shown in FIG. 1. Then, when releasing the downward force, the movable cover 13 moves upwardly by a spring force.

In this state, since the R-surface member 36 of the urging mechanism assembly 37 is freed from the engaging member 17, each urging mechanism assembly 37 is placed in contact with the outer end surface of each external lead 3 of the semiconductor device 1 by the force of the spring 34, and the semiconductor device 1 is positioned based on the tip positions of the external leads 3 by the urging of the outer end surface of each external lead 3 from an outer position to an inner position.

Simultaneously, each movable contact terminal 18, under pressure, makes contact with the top surface of the tip of the external lead 3 and of the movable contact 31, which is placed in contact with the external lead 3, to connect them electrically to each other. This results in the connection of each external lead 3 to an external testing circuit via each movable contact terminal 18 and each movable contact 31. Accordingly, it is desirable that each top surface of the tip of the external lead 3 be flush with that of the movable contact 31, which is placed in contact with the external lead 3. The length of an electrical path between the external lead 3 and the external testing circuit is much shorter than that of conventional sockets making it suitable for transmission of high-speed signals.

In addition, the movable contact terminal 18 is F designed to contact the external lead 3 and the movable contact 31 under pressure resulting from moving down obliquely, and has a lug (not shown) for wiping.

The urging mechanism assembly 37, although shown in enlarged for better understanding, is very compact so that it can be provided for each external lead 3. The stroke from an outer position to an inner position can be minimized within a necessary performance, enabling miniaturization of the overall size of the socket 100.

Second Embodiment

Figure 4:
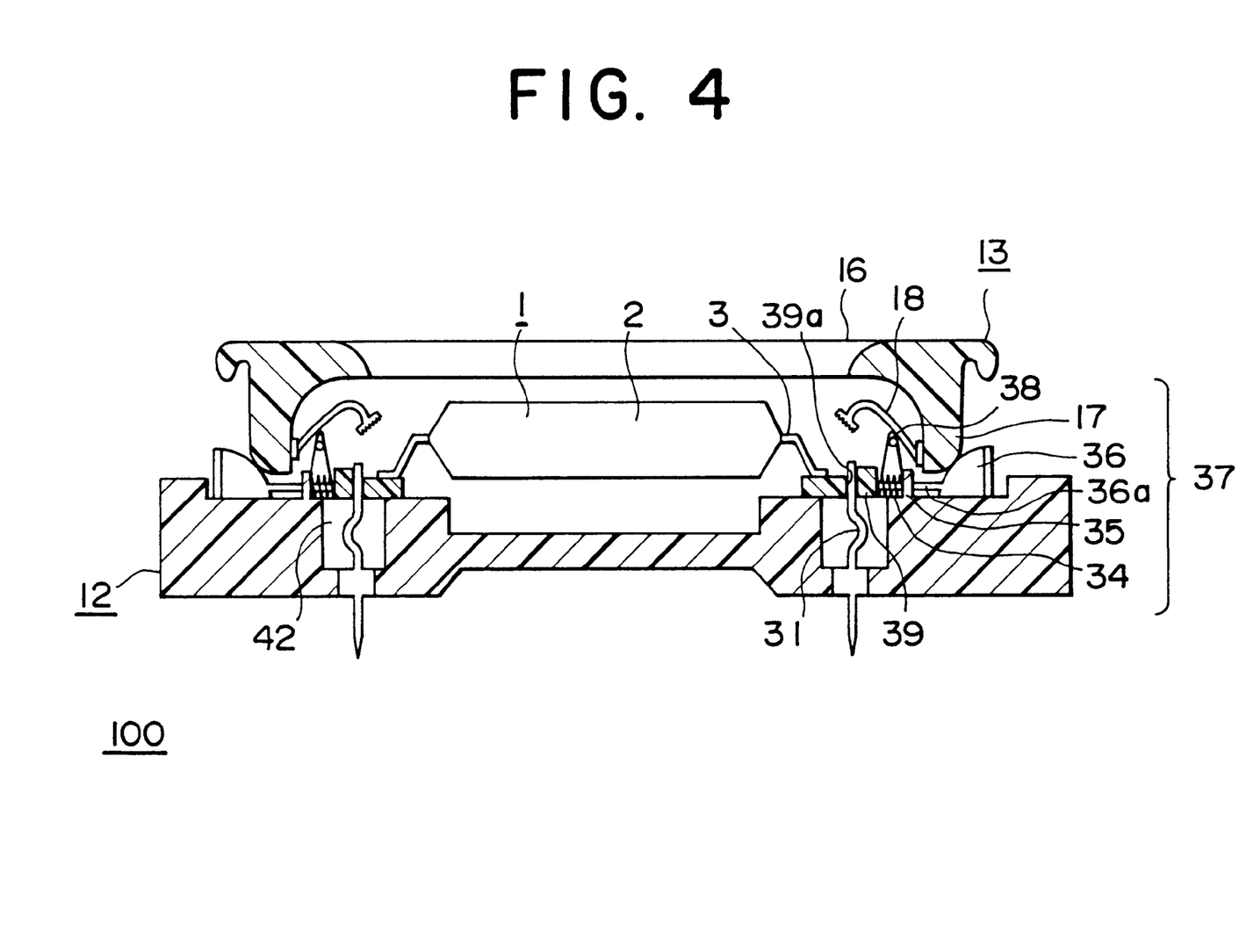
FIG. 4 is a sectional side view showing a semiconductor device in a socket in accordance with another embodiment of the present invention.
Figure 5:
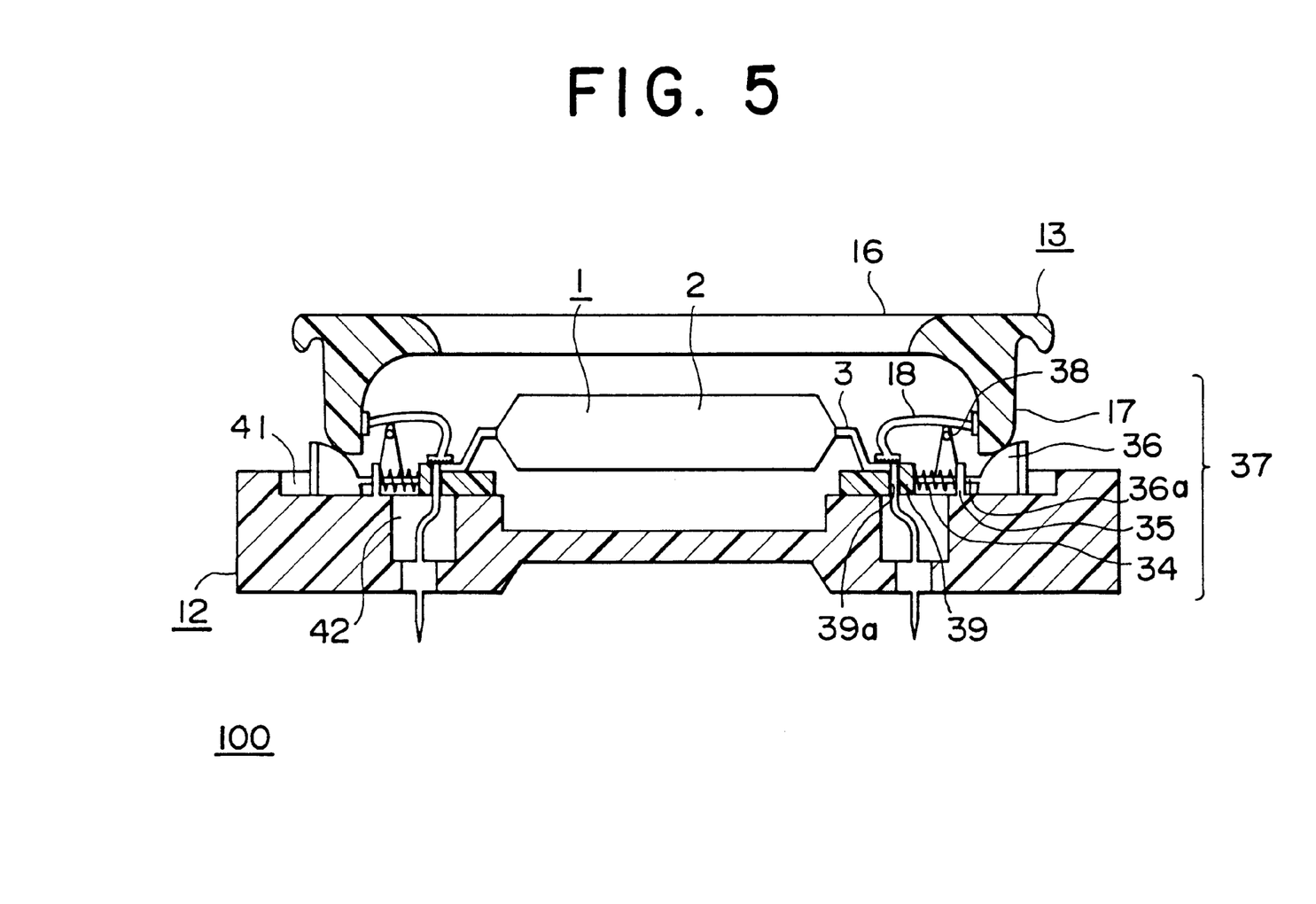
FIG. 5 is a sectional side view showing positioning and testing the semiconductor device in the socket shown in FIG. 4.

FIGS. 4 and 5 are sectional side views showing a configuration of a socket for a semiconductor device in accordance with a Second Embodiment of the present invention. FIG. 4 shows a state in which the socket is ready for the setting of a semiconductor device. FIG. 5 shows a the set semiconductor device and simultaneous electrical connection between the external leads and an external testing circuit (not shown).

In both drawings, members that are common with or equivalent to those of the First Embodiment are designated by using like characters for brevity. In this Second Embodiment, a movable support plate 39 is provided for each package side having the external leads 3 with a difference in level. Therefore an outer portion of the movable supporting plate is thicker than its inner portion, which supports the external leads of the semiconductor device 1. The movable supporting plate 39 has through holes 39a at an inside edge portion, the through holes 39a slidingly containing the movable contacts 31, and which are placed in contact with the outer end surfaces of the external leads 3. The urging mechanism assembly 37, as in the First Embodiment, moves these movable supporting plates 39 and movable contacts 31. The overall performance of this embodiment is the same as that of the First Embodiment. By means of the urging mechanism assembly 37, which moves the movable supporting plate 39 from an outer position to an inner position, the tip of the external lead 3 is urged indirectly by the movable contact 31 extending through the through hole 39a of the movable supporting plate 39.

Figure 6:
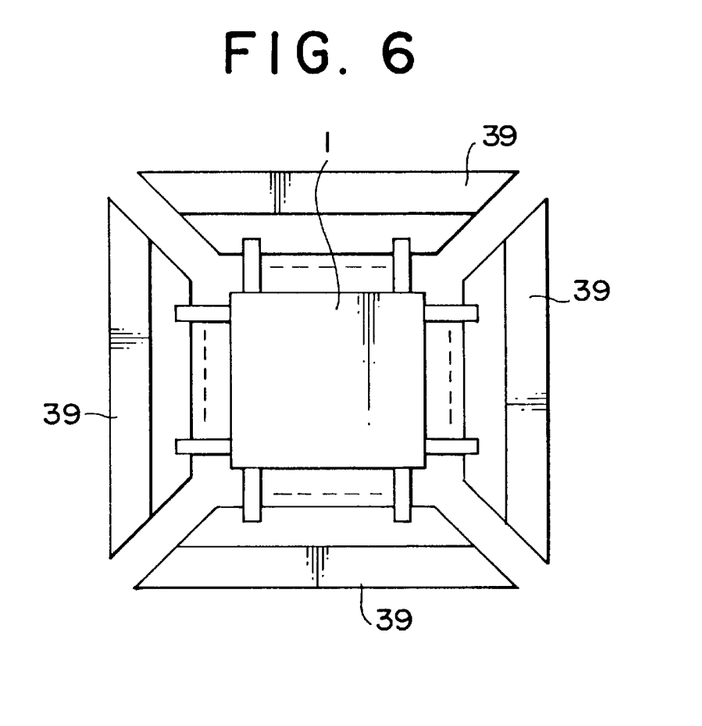
FIG. 6 is a schematic diagram showing the relationship between the semiconductor device in the socket shown in FIG. 4 and movable supporting plates.
Figure 7:
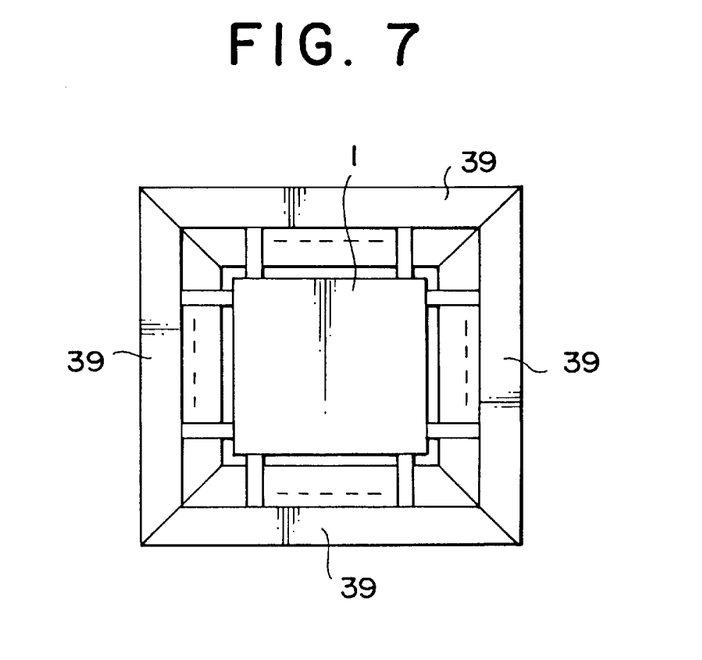
FIG. 7 is a schematic diagram showing the relationship between the semiconductor device being tested and the movable supporting plates.

FIGS. 6 and 7 are schematic diagrams showing the relationship between the semiconductor device 1 and the movable supporting plates 39. FIG. 6 shows a state of the semiconductor device 1 ready to be set, as shown in FIG. 4. FIG. 7 shows the semiconductor device positioned and the external leads simultaneously electrically connected to an external testing circuit. The movable supporting plates 39 are disposed singularly on every side of the semiconductor device 1, and are moved by the urging mechanism assembly 37 outwardly when setting in or removing the semiconductor device 1, as shown in FIG. 6, and inwardly when positioning and testing the semiconductor device 1, as shown in FIG. 7.

Figure 8:
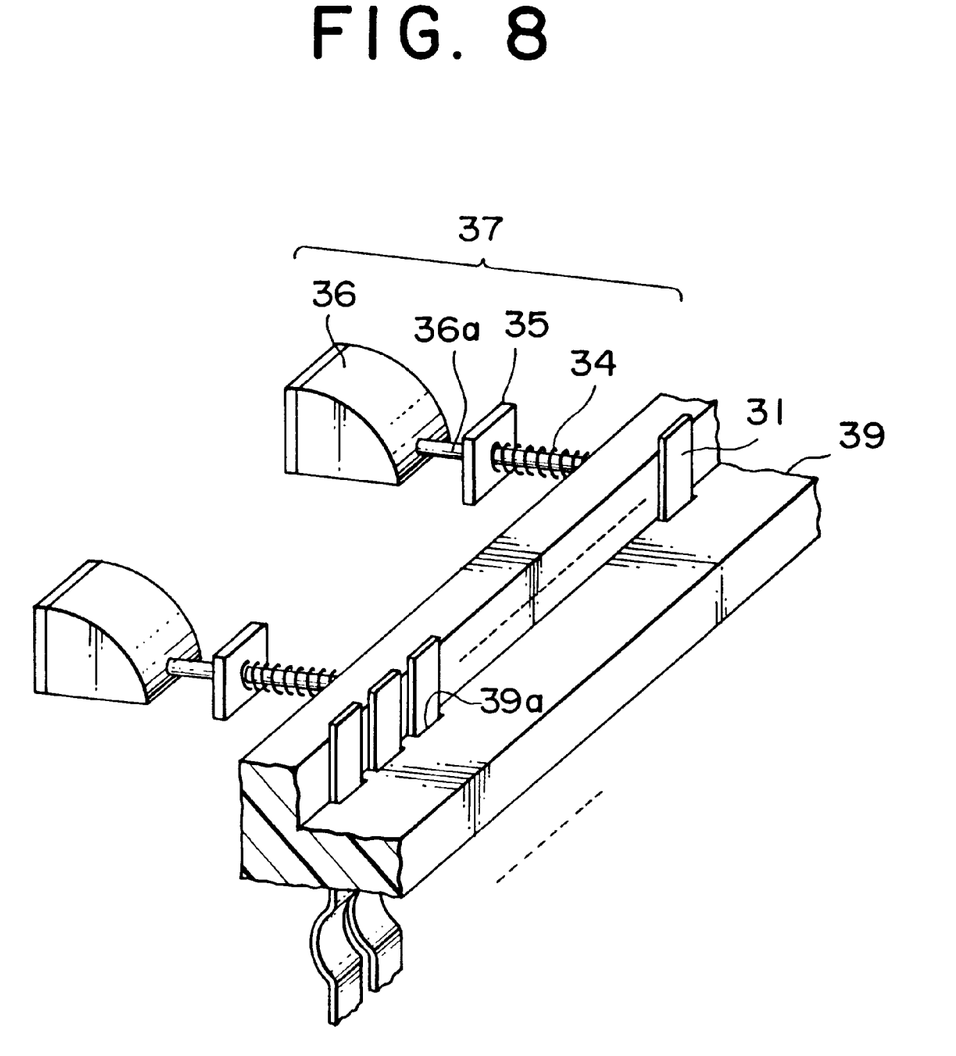
FIG. 8 shows the relationship between the movable supporting plates and urging mechanism assemblies.

Further, while the an urging mechanism assembly 37 is provided for each movable contact 31 in the First Embodiment, these can be provided individually at each end of the movable supporting plates 39, which are disposed individually on each side of the semiconductor device 1, in the Second Embodiment, as shown in FIG. 8.

In the First and Second Embodiments, the shape of the external lead is not limited to the gull-wing shape and may be a straight shape or another shape.

As mentioned above, the present invention provides a socket for a semiconductor device for use as an electrical connection between external leads of the semiconductor and an external circuit to test the semiconductor, the socket which can be miniaturized, having a commonality for use as long as the number and the positions of the external leads of the semiconductor device are the same, and being suitable for transmission of high-speed signals, the socket for the semiconductor device comprising a body and a movable cover, in which the body includes a plurality of movable contacts having a springing property being disposed in positions corresponding to each external lead and surrounding the position where the semiconductor is set, and the body further includes positioning means for positioning the semiconductor device by urging the movable contacts inwardly toward the outer end surface of each external lead from an outer position, and in which the movable cover being capable of moving up and down above the body includes a plurality of movable contact terminals to connect each external lead to the movable contact that corresponds to the external lead, wherein when the movable cover moves closer to the body, the semiconductor device is ready to be set, and when it moves away from the body the positioning means performs positioning by placing each movable contact in contact with the outer end surface of each external lead by urging the movable contacts inwardly from an outer position, while simultaneously the movable contact terminals, by their springing property, make contact under pressure with the upper surfaces of each external lead and of each movable contact, which is placed in contact with the external lead, to electrically connect them to each other.

The present invention further provides a socket for a semiconductor device, having a relatively simplified construction in addition to the above-mentioned effects, wherein the positioning means comprises an urging mechanism assembly which urges the movable contacts toward the external leads according to the movable cover operation, wherein the body further comprises projection portions which actuate each movable contact terminal of the movable cover against a spring force of the movable contact terminal according to the movable cover operation.

The present invention also provides a socket for a semiconductor device, having a further simplified construction in addition to above-mentioned effects, wherein the positioning means further comprises a plurality of movable supporting plates having a difference in level wherein an outer portion of the movable supporting plate is thicker than an inner portion which supports the external leads, the movable supporting plate having through holes at an inside edge portion of the difference in level containing the movable contacts which are placed in contact with the outer surfaces of the external leads, the movable supporting plate extending in the direction of a row of the external leads; and an urging mechanism assembly which urges the movable contacts toward the external leads by moving the movable supporting plates according to the movable cover operation, wherein the bode further comprises projection portions which actuate the movable contact terminals against a spring force thereof according to the movable cover operation.

What is claimed is:

1. A socket for making electrical connection between external leads of a semiconductor device and an external circuit to test the semiconductor device, said socket comprising:

a body including a plurality of movable resilient contacts disposed in positions corresponding to external leads of a semiconductor device and surrounding a position where the semiconductor device is placed for connection, said body including positioning means for positioning the semiconductor device by urging said movable contacts inwardly toward an outer end surface of the corresponding external leads from an outer position; and a movable cover moving transversely to said body and including a plurality of movable contact terminals for connecting each of the external leads to a corresponding movable contact, wherein when said movable cover moves closer to said body, the semiconductor device can be set in place, and when said movable cover moves farther away from said body, said positioning means positions the semiconductor device by placing said movable contacts in contact with outer surfaces of the corresponding leads, urging said movable contacts inwardly from an outer position, while, simultaneously, said movable contact terminals resiliently contact upper surfaces of the corresponding external leads, establishing electrical connections.

2. The socket for a semiconductor device according to claim 1, wherein said positioning means comprises an urging mechanism assembly which urges said movable contacts toward the external leads in response to operation of said movable cover, wherein said body comprises projecting portions which actuate said movable contact terminals against a spring force of said movable contact terminals in response to operation of said movable cover.

3. The socket for a semiconductor device according to claim 1, wherein said positioning means comprises:

a plurality of movable supporting plates wherein an outer portion of each of said movable supporting plates is thicker than an inner portion which supports the external leads, said movable supporting plates having through holes at an inside edge portion, containing said movable contacts for contacting the outer end surfaces of the external leads, said movable supporting plates extending along a row of said external leads; and an urging mechanism assembly which urges said movable contacts toward the external leads by moving said movable supporting plates in response to operation of said movable cover, wherein said body comprises projecting portions which actuate said movable contact terminals against a spring force in response to operation of said movable cover.

* * * * *